US009081062B1

(12) United States Patent
Pedersen

(10) Patent No.: US 9,081,062 B1
(45) Date of Patent: Jul. 14, 2015

(54) MEMORY ERROR DETECTION AND CORRECTION CIRCUITRY

(75) Inventor: Bruce B. Pedersen, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 518 days.

(21) Appl. No.: 12/870,383

(22) Filed: Aug. 27, 2010

(51) Int. Cl.
*G11C 29/00* (2006.01)
*G01R 31/3181* (2006.01)
*G06F 11/10* (2006.01)

(52) U.S. Cl.
CPC ........ *G01R 31/31816* (2013.01); *G06F 11/106* (2013.01)

(58) Field of Classification Search
CPC ............ G01R 31/31816; G06F 11/106; G06F 11/1068
USPC .................................................. 714/763, 719
See application file for complete search history.

(56) References Cited

U.S. PATENT DOCUMENTS

| 7,634,713 | B1 | 12/2009 | Ngo | |
|---|---|---|---|---|
| 2004/0015757 | A1* | 1/2004 | Ohlhoff et al. | 714/719 |
| 2004/0218420 | A1* | 11/2004 | Aakjer | 365/185.02 |
| 2006/0010346 | A1* | 1/2006 | Minemier | 714/30 |
| 2007/0283193 | A1* | 12/2007 | Lewis et al. | 714/48 |
| 2008/0273393 | A1* | 11/2008 | Chen et al. | 365/185.21 |
| 2010/0125765 | A1* | 5/2010 | Orbach et al. | 714/718 |

OTHER PUBLICATIONS

Ngo, U.S. Appl. No. 12/608,835, filed Oct. 29, 2009.
Ngo, U.S. Appl. No. 11/436,967, filed May 16, 2006.
Tan, Jun Pin, et al., U.S. Appl. No. 12/814,713, filed Jun. 14, 2010.
Pedersen, Bruce B., U.S. Appl. No. 12/407,750, filed Mar. 19, 2009.

* cited by examiner

*Primary Examiner* — M. Mujtaba K Chaudry
(74) *Attorney, Agent, or Firm* — Treyz Law Group; Jason Tsai; Michael H. Lyons

(57) ABSTRACT

Integrated circuits with memory error detection and correction (EDC) circuitry are provided. The EDC circuitry may include first and second data registers and a comparator. The first data register may store data read from a selected frame. The second data register may be loaded with a predetermined bit stream. If a soft error is detected, correct bits generated using a logic function associated with the predetermined bit stream may be written back to the selected frame. In another suitable arrangement, the EDC circuitry may include first and second registers, a mask register, and a comparator. The first data register may store data read from a selected frame. The second data register may be loaded with desired data. The mask register may be loaded with mask bits. If a soft error is detected, the correct bits may be written back to the selected frame if the corresponding mask bits are high.

15 Claims, 12 Drawing Sheets

| DATA-B_BIT (X) | DATA-A_BIT (Y) | X·Ȳ | X+Y | X·Y | X+Ȳ | X⊕Y | ... |
|---|---|---|---|---|---|---|---|
| 0 | 0 | 0 | 0 | 0 | 1 | 0 | |
| 0 | 1 | 0 | 1 | 0 | 0 | 1 | |
| 1 | 0 | 1 | 1 | 0 | 1 | 1 | |
| 1 | 1 | 0 | 1 | 1 | 1 | 0 | |

Columns labeled: 200, 202, 204, 206, 208

FIG. 6

| | DESIRED BIT | DATA-B_BIT (X) | DATA-A_BIT (Y) | 1st PASS NEW CRAM VALUES BASED ON X·Ȳ (X') | DATA-A_BIT (Y') | 2nd PASS NEW CRAM VALUES BASED ON X'+Y' (X'') |
|---|---|---|---|---|---|---|
| 222 { | X | 0 | 0 | 0 | 0 | 0 |
| | X | 1 | 0 | 1 | 0 | 1 |
| | X | 0 | 0 | 0 | 0 | 0 |
| | X | 0 | 0 | 0 | 0 | 0 |
| 224 { | 0 | 0 | 0 | 0 | 0 | 0 |
| | 1 | 0 | 1 | 0 | 1 | 1 } 226 |
| | 0 | 1 | 0 | 0 | 0 | 0 } 228 |
| | 1 | 1 | 0 | 1 | 1 | 1 |
| 222 { | X | 0 | 0 | 0 | 0 | 0 |
| | X | 0 | 0 | 0 | 0 | 0 |
| | X | 0 | 0 | 0 | 1 | 0 |
| | X | 1 | 0 | 1 | 0 | 1 |
| | 210 | 212 | 214 | 216 | 218 | 220 |

FIG. 7

| | DESIRED BIT | MASK BIT | DATA-A_BIT | DATA-B_BIT | NEW CRAM VALUES |
|---|---|---|---|---|---|
| 158 { | X | 0 | 0 | 0 | 0 } 162 |
| | X | 0 | 0 | 1 | 1 } 164 |
| | X | 0 | 0 | 0 | 0 |
| | X | 0 | 0 | 0 | 0 |
| 160 { | 0 | 1 | 0 | 0 | 0 |
| | 1 | 1 | 1 | 0 | 1 } 168 |
| | 0 | 1 | 0 | 1 | 0 |
| | 1 | 1 | 1 | 1 | 1 } 166 |
| 158 { | X | 0 | 0 | 0 | 0 |
| | X | 0 | 0 | 0 | 0 |
| | X | 0 | 0 | 0 | 0 |
| | X | 0 | 0 | 1 | 1 |
| | 230 | 232 | 234 | 236 | 238 |

FIG. 11

MEMORY ERROR DETECTION AND CORRECTION CIRCUITRY

BACKGROUND

This relates to integrated circuits and more particularly, to circuitry for detecting and correcting soft memory errors in integrated circuits such as programmable integrated circuits.

Programmable integrated circuits are a type of integrated circuit that can be programmed by a user to implement a desired custom logic function. In a typical scenario, a logic designer uses computer-aided design tools to design a custom logic circuit. When the design process is complete, the tools generate configuration data. The configuration data is loaded into memory elements to configure the devices to perform the functions of the custom logic circuit.

Memory elements are often based on random-access-memory (RAM) cells. Because the RAM cells are loaded with configuration data during device programming, the RAM cells are sometimes referred to as configuration memory or configuration random-access-memory cells (CRAM).

During normal operation of a programmable device, loaded CRAM cells produce static output signals that are applied to the gates of transistors (e.g., pass transistors). The CRAM output signals turn some transistors on and turn other transistors off. This selective activation of certain transistors on the device customizes the operation of the device so that the device performs its intended function.

When operating in a system, programmable devices are subject to environmental background radiation. Particularly in modern programmable devices that contain large numbers of CRAM cells, there is a possibility that a radiation strike on a CRAM cell will cause the CRAM cell to change its state. For example, a CRAM cell storing a "1" configuration bit may flip its state so that the cell erroneously stores a "0" bit. When a CRAM cell changes state, the transistor that is controlled by that CRAM cell will be placed into an erroneous state. The transistor might, for example, be turned on when it should have been turned off.

Radiation-induced errors that arise in configuration random-access-memory cells are sometimes referred to as soft errors. One way in which soft errors can be addressed is to change the design of the configuration random-access-memory cells. However, changes to the configuration random-access-memory cells can introduce undesired circuit complexity and can consume additional circuit real estate.

Programmable devices sometimes include error detection circuitry that continuously monitors an entire array of CRAM cells. If an error is detected in the array, an error flag may be set. Systems that require highly reliable operations can monitor the status of the error flag to determine whether the programmable device has experienced any soft errors. So long as no errors are present, the system allows the programmable device to operate normally. If, however, the state of the error flag indicates that one of the configuration random-access-memory cells on the device has exhibited a soft error, the system can reconfigure the device by reloading the original configuration data into the configuration random-access-memory cells. Reloading the entire programmable device every time a soft error is detected may, however, result in unnecessarily frequent disruptions and may consume significant amounts of power.

In an effort to reduce the amount of power consumed during device reconfiguration, partial reconfiguration techniques are sometimes used. Partial reconfiguration techniques are typically used to load configuration data into a portion of a device without regard to whether or not an error is present in the device.

Conventional error detection circuitry such as error detection circuitry that uses cyclic redundancy check (CRC) may only be capable of detecting and identifying the location of a limited number of soft errors. For example, conventional error detection circuitry may only be able to detect two soft errors on a programmable device. If there are three soft errors on the programmable device, conventional error detection circuitry may produce an incorrect error message or may not be able to properly locate the position of the three soft errors.

It would therefore be desirable to be able to provide integrated circuits with improved error detection circuitry.

SUMMARY

Integrated circuits such as programmable integrated circuits may have memory elements coupled to error detection and correction circuitry. The error detection circuitry may be used to monitor (scan) the memory cells for the presence of soft errors.

For example, a programmable integrated circuit may contain one or more arrays of configuration random-access-memory (CRAM) cells. Each array may contain rows and columns of configuration random-access-memory cells that are used for storing configuration data. The integrated circuit may also be organized into different logic regions, each logic region having its own set of memory arrays.

Memory cells that are connected to a common address line may collectively be referred to as a "frame." The error detection and correction circuitry may process each frame to scan for soft errors and may optionally correct a soft error if detected.

The memory error detection and correction circuitry may include first and second data registers, a control circuit, and a comparator. The first and second data registers may be shift registers (as an example). During error detection mode, data read from a selected frame may be latched by the first data register.

During a first pass, the control circuit may load the second data register with a first predetermined bit stream (predetermined data bits) that corresponds to the selected frame and that is associated with a first error correction logic function. Data from the first and second data registers may be serially shifted to the comparator for bit-wise comparisons. The comparator may assert error signals if a soft error is detected.

The comparator may perform error detection based on a first error detection logic function that is associated with the first error correction logic function. If at least one of the error signals is high during the first pass, the control circuit may be used to optionally write back correct data into the selected frame. The correct data may be generated using the first error correction logic function that takes bits from the first and second data registers as inputs.

During a second pass, the control circuit may load the second data register with a second predetermined bit stream that corresponds to the selected frame and that is associated with a second error correction logic function. Data may be serially shifted to the comparator for bit-wise comparisons. The comparator may perform error detection based on a second error detection logic function that is associated with the second error correction logic function. If at least one of the error signals is high during the second pass, the control circuit may be used to optionally write back correct data into the selected frame. The correct data may be generated using the second error correction logic function that takes bits from the first and second data registers as inputs.

If desired, a device reset or an application specific response may be used to correct the soft error. Error correction may selectively correct sensitive bits (e.g., bits that can adversely affect the functionality of a programmable circuit if flipped by impinging radiation), if desired.

Computer-aided design (CAD) tools may be used to calculate the predetermined bit streams for the first and second passes for each frame. The CAD tools calculates the predetermined bit streams based on a desired pattern of configuration data that is to be loaded into the array and based on desired error correction logic functions.

In another suitable arrangement, the error detection and correction circuitry may include first and second data registers, a mask register, a control circuit, and a comparator. During error detection mode, data read from a selected frame may be loaded into the first data register. The control circuit may load the mask register with mask bits. The mask bits may serve to indicate the position of sensitive bits and the position of non-sensitive bits (e.g., mask bits that are logic "1" correspond to sensitive bits, whereas mask bits that are logic "0" correspond to non-sensitive bits).

The control circuit may load the second data register with correct data. The portion of the correct data that corresponds to the sensitive bits may represent desired configuration bits for proper functionality of the device, whereas the portion of the correct data that corresponds to the non-sensitive bits has bit values at logic "0" (as an example).

The comparator may be used to perform bit-wise data comparison between the bits from the first and second data registers. If there is a data mismatch, then a soft error is detected and an error signal is raised. If the data matches, then the error signal is low. If the error signal is raised at least once during an error detection session for the selected frame, correct data may optionally be written back to the portion of the selected frame with sensitive bits. If desired, a device reset or application specific response may be used to correct the soft error.

Further features of the present invention, its nature and various advantages will be more apparent from the accompanying drawings and the following detailed description.

BRIEF DESCRIPTION OF THE DRAWINGS

FIG. 6 is a truth table showing illustrative logic functions that may be used in conjunction with the memory error detection and correction circuitry of FIG. 4 in accordance with an embodiment of the present invention.

FIG. 7 is a truth table showing illustrative data bits that may be loaded into data registers in the memory error detection and correction circuitry of FIG. 4 in accordance with an embodiment of the present invention.

FIG. 11 is a truth table showing illustrative data bits that may be loaded into data registers in the memory error detection and correction circuitry of FIG. 9 in accordance with an embodiment of the present invention.

DETAILED DESCRIPTION

This relates to integrated circuits and more particularly, to integrated circuits with memory elements.

Integrated circuits that contain memory elements may include memory chips, digital signal processing circuits with memory arrays, microprocessors, application specific integrated circuits with memory arrays, programmable logic device integrated circuits or other programmable integrated circuits in which memory elements are used for configuration memory, or other suitable integrated circuits.

Integrated circuits such as programmable integrated circuits use programmable memory elements to store configuration data. During the programming of a programmable integrated circuit, configuration data is loaded into the memory elements. During operation of the programmable integrated circuit, each memory element provides a static output signal. The static output signals that are supplied by the memory elements serve as control signals. These control signals are applied to programmable logic on the integrated circuit to customize the programmable logic to perform a desired logic function.

Memory elements may be organized in arrays having numerous rows and columns. For example, memory array circuitry may be formed in hundreds or thousands of rows and columns on a programmable logic device integrated circuit. Programmable integrated circuit 10 of FIG. 1 is an example of an illustrative integrated circuit on which memory array circuitry may be formed.

Figure 1:
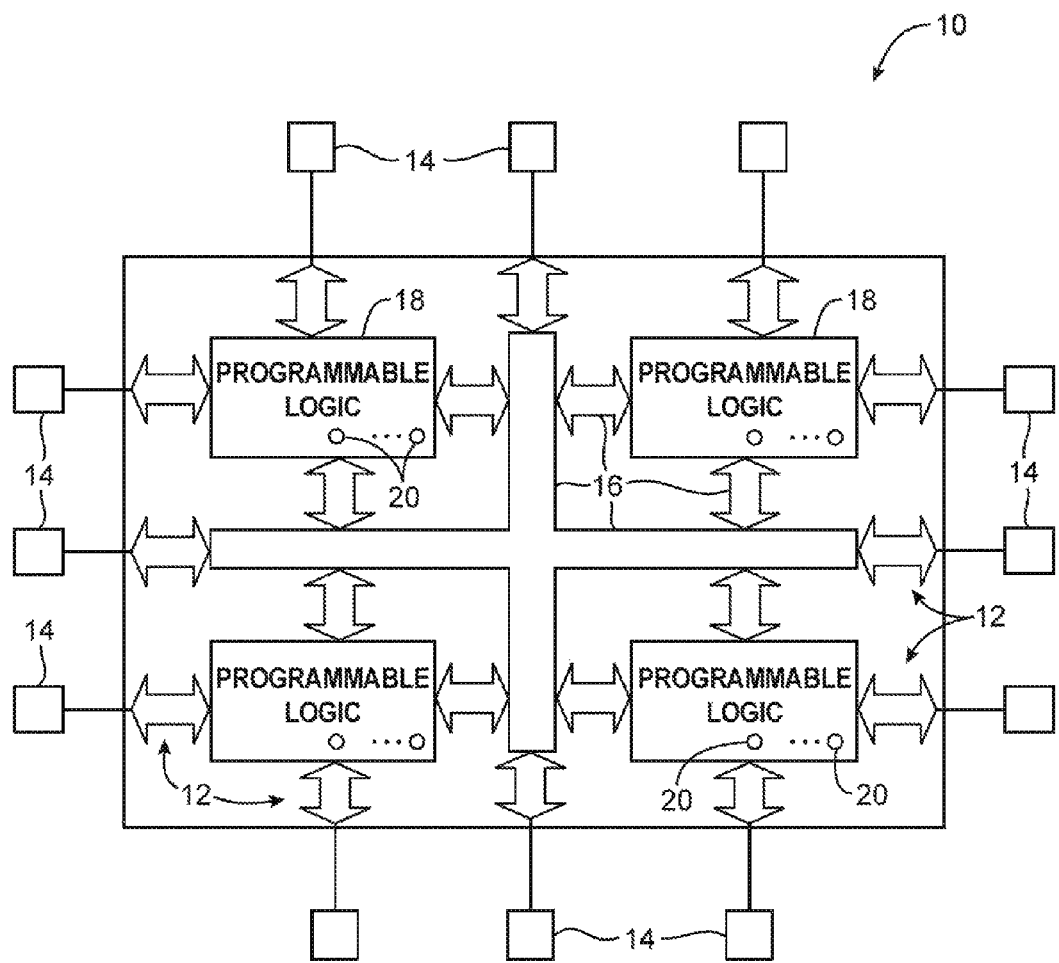
FIG. 1 is a diagram of an illustrative programmable integrated circuit in accordance with an embodiment of the present invention.

As shown in FIG. 1, programmable integrated circuit 10 may have input-output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function.

Programmable integrated circuit 10 contains memory elements 20 that can be loaded with configuration data (also called programming data) using pins 14 and input-output circuitry 12. Once loaded, the memory elements each provide a corresponding static control output signal that controls the state of an associated logic component in programmable logic 18. Typically the memory element output signals are used to control the gates of metal-oxide-semiconductor (MOS) transistors. Some of the transistors may be p-channel metal-oxide-semiconductor (PMOS) transistors. Many of these transistors may be n-channel metal-oxide-semiconductor (NMOS) pass transistors in programmable components such as multiplexers. When a memory element output is high, an NMOS pass transistor controlled by that memory element will be turned on to pass logic signals from its input to its output. When the memory element output is low, the pass transistor is turned off and does not pass logic signals.

A typical memory element 20 is formed from a number of transistors configured to form cross-coupled inverters. Other arrangements (e.g., cells with more distributed inverter-like circuits) may also be used. With one suitable approach, complementary metal-oxide-semiconductor (CMOS) integrated circuit technology is used to form the memory elements 20, so CMOS-based memory element implementations are described herein as an example. In the context of programmable integrated circuits, the memory elements store configuration data and are therefore sometimes referred to as configuration random-access memory (CRAM) cells.

Figure 2:
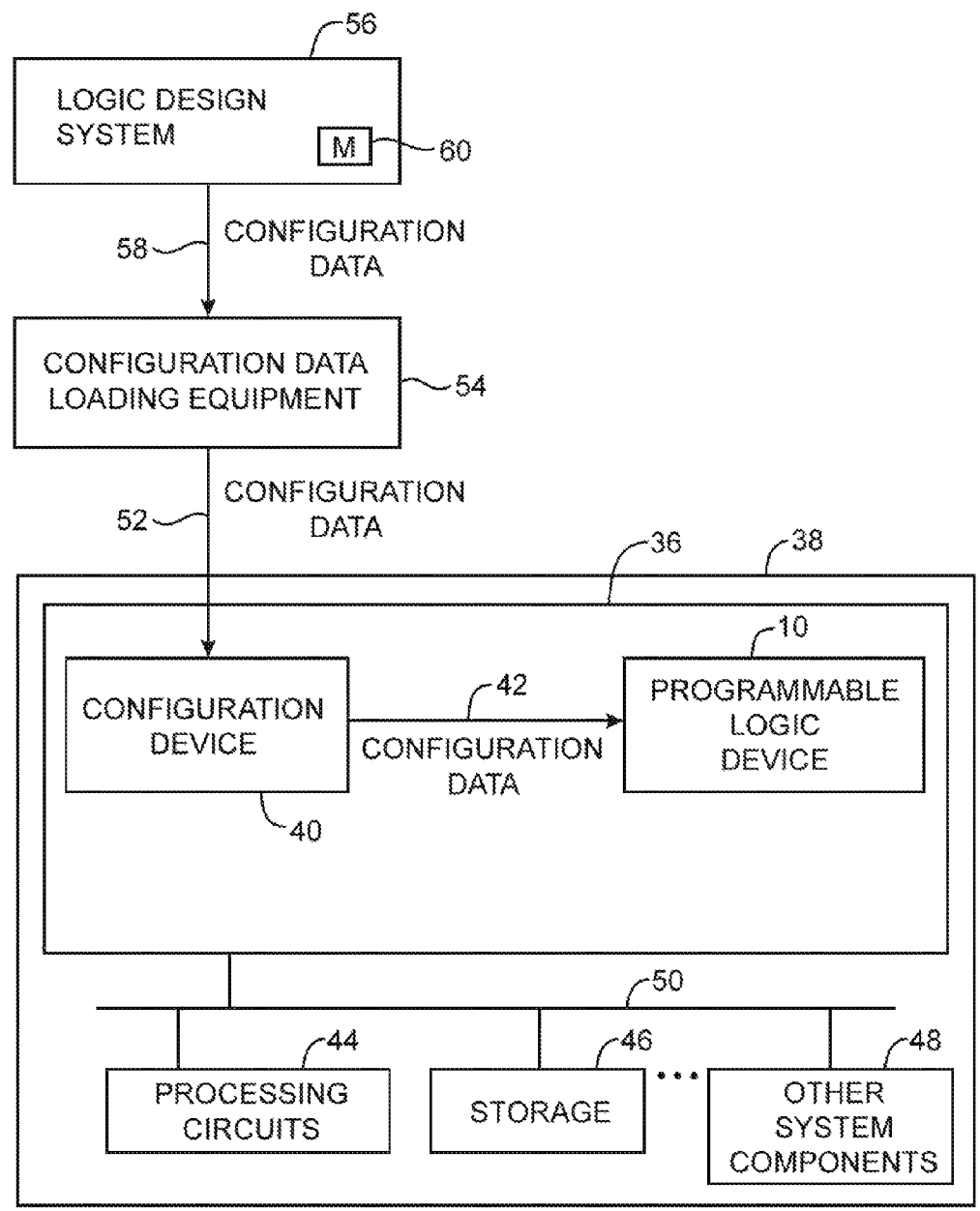
FIG. 2 is a diagram showing how configuration data is created by a logic design system and loaded into a programmable device to configure the device for operation in a system in accordance with an embodiment of the present invention.

An illustrative system environment for device 10 is shown in FIG. 2. Device 10 may be mounted on a board 36 in a system 38. In general, programmable logic device 10 may receive configuration data from programming equipment or from other suitable equipment or device. In the example of FIG. 2, programmable logic device 10 is the type of programmable logic device that receives configuration data from an associated integrated circuit 40. With this type of arrangement, circuit 40 may, if desired, be mounted on the same board 36 as programmable logic device 10. Circuit 40 may be an erasable-programmable read-only memory (EPROM) chip, a programmable logic device configuration data loading chip with built-in memory (sometimes referred to as a configuration device), or other suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings and may be interconnected by buses and other electrical paths 50.

Configuration device 40 may be supplied with the configuration data for device 10 over a path such as path 52. Configuration device 40 may, for example, receive the configuration data from configuration data loading equipment 54 or other suitable equipment that stores this data in configuration device 40. Device 40 may be loaded with data before or after installation on board 36.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 56 may be provided to equipment 54 over a path such as path 58. The equipment 54 provides the configuration data to device 40, so that device 40 can later provide this configuration data to the programmable logic device 10 over path 42. System 56 may be based on one or more computers and one or more software programs. In general, software and data may be stored on any computer-readable medium (storage) in system 56 and is shown schematically as storage 60 in FIG. 2.

In a typical scenario, logic design system 56 is used by a logic designer to create a custom circuit design. The system 56 produces corresponding configuration data which is provided to configuration device 40. Upon power-up, configuration device 40 and data loading circuitry on programmable logic device 10 is used to load the configuration data into CRAM cells 20 of device 10. Device 10 may then be used in normal operation of system 38.

Figure 3:
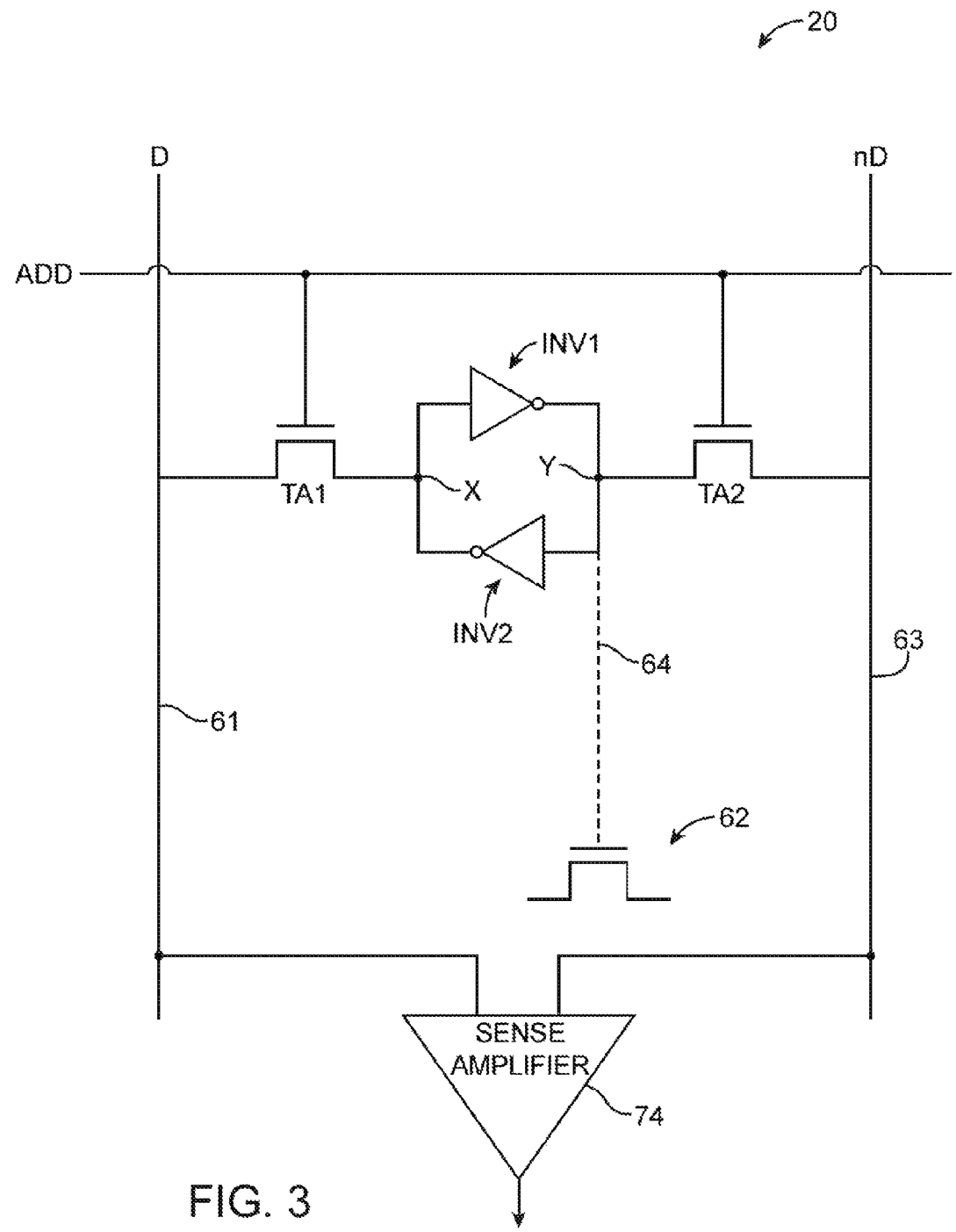
FIG. 3 is a circuit diagram of an illustrative memory element in accordance with an embodiment of the present invention.

FIG. 3 is a circuit diagram of CRAM cell 20. As shown in FIG. 1, cell 20 may include a pair of cross-coupled inverters (e.g., a latch) and two access transistors. The latch may include inverters INV1 and INV2. Inverter INV1 may have an output that is connected to an input of inverter INV2, whereas inverter INV2 may have an output that is connected to an input of inverter INV1. Inverters INV1 and INV2 cross-coupled in this way form a storage portion for cell 20.

The storage portion of cell 20 may be a bi-stable element that stores data at first and second data storage nodes (e.g., first data storage node X and second data storage node Y). The output of inverter INV1 may be connected to second data storage node Y, whereas the output of inverter INV2 may be connected to first data storage node X (see, e.g., FIG. 3).

Access transistors such as access transistors TA1 and TA2 may be connected to the storage portion of memory cell 20 to perform read and write operations. As shown in FIG. 3, access transistor TA1 may be coupled between a first data line such as first data line 61 (e.g., a true data line on which true data signal D is conveyed) and first data storage node X, whereas access transistor TA2 may be coupled between a second data line such as second data line 63 (e.g., a complementary data line on which complement data signal nD is conveyed) and second data storage node Y. Transistors TA1 and TA2 may each have a gate that is connected to an address line on which address signal ADD is conveyed. Transistors TA1 and TA2 may therefore sometimes be referred to as address transistors.

During normal operation (e.g., a normal operating mode in which cell 20 holds configuration data), address signal ADD is deasserted (e.g., address signal ADD is pulled low) to turn off access transistors TA1 and TA2 so that the storage portion of cell 20 holds stored data values at data storage nodes X and Y. For example, cell 20 holding a "0" may have first data storage node X at logic "1" and second data storage node Y at logic "0."

During read operations, data lines 61 and 63 may be precharged (e.g., data signals D and nD may be precharged to a high voltage). Address signal ADD may then be asserted (e.g., address signal ADD may be raised high) to enable access transistors TA1 and TA2 to read data from cell 20. Sensing circuitry such as sense amplifier 74 may be coupled to data lines 61 and 63 to determine whether cell 20 is storing a "0" (e.g., whether storage node Y is storing a "0") or a "1" (e.g., whether storage node Y is storing a "1").

During write operations, desired data values may be presented at data lines 61 and 63 and address signal ADD may be asserted to enable access transistor TA1 and TA2 to write the desired data values into cell 20. For example, signal D on line 61 may be at logic "1" while signal nD on line 63 may be at logic "0" to write in a "0" into cell 20.

Each memory cell 20 may supply a corresponding output signal on a corresponding output path 64. Output path 64 may be connected to data storage node Y. Each output signal is a static output control signal that may be used in configuring a corresponding transistor such as transistor 62 (e.g., the output signal may be used to control a gate of corresponding transistor 62) or other circuit element in an associated programmable logic circuit. Transistor 62 may sometimes be referred to as a pass transistor or a pass gate. The state of transistor 62 (off or on) controls whether signals are allowed to pass between its source-drain terminals.

Memory cell 20 shown in FIG. 3 is merely illustrative. The storage portion of memory cell 20 may have more than two cross-coupled inverters. If desired, memory cell 20 may be implemented using single-ended read/write schemes, may include a clear transistor (e.g., a transistor that may be globally enabled to clear the contents of the memory cells on device 10), etc.

CRAM cells 20 that are loaded with configuration data are subject to soft errors (e.g., errors induced by strikes from alpha particles and cosmic rays). The change in state of even a single CRAM bit may disrupt the operation of device 10. As a result, device 10 may include error detection and correction circuitry such as error detection and correction circuitry 80 that is used to detect soft errors on device 10 and to optionally correct the detected soft errors (see, e.g., FIG. 4).

Figure 4:
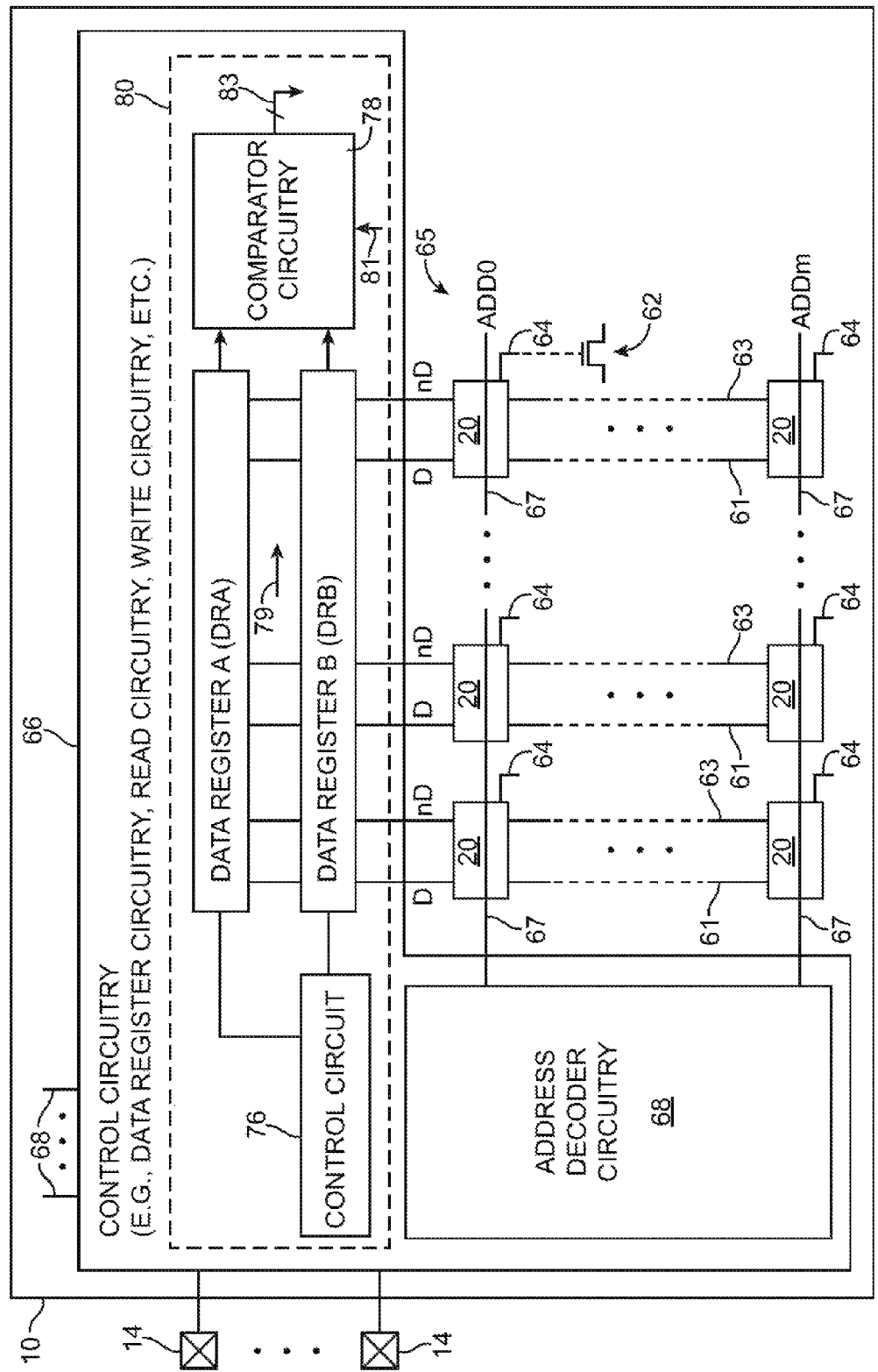
FIG. 4 is a diagram of an illustrative integrated circuit with memory error detection and correction circuitry in accordance with an embodiment of the present invention.

FIG. 4 shows an integrated circuit that includes an array 65 of memory cells 20. In general, there may be hundreds or thousands of rows and columns in memory array 65. Array 65 may be one of a number of arrays on given device 10, may be a subarray that is part of a larger array, or may be any other suitable group of memory cells 20.

Each memory element may supply a corresponding output signal on corresponding output path 64. In CRAM arrays, each output signal is a static output control signal that may be used in configuring a corresponding transistor such as transistor 62.

Integrated circuit 10 may have control circuitry 66 for supplying signals to memory array 65. Control circuitry 66 may receive power supply voltages, data, and other signals from external sources using pins 14 and from internal sources using paths such as paths 68. Control circuitry 66 may include circuitry such as data register circuitry, circuitry for controlling read and write operations, etc. Control circuitry 66 may use the power supply voltages supplied by pins 14 and 16 to produce desired fixed signals and time-varying signals on lines such as lines 67 and data lines 61 and 63.

For example, each row of array 65 may have an associated address line 67 (sometimes referred to as a word line), whereas each column of array 65 may have associated data lines (e.g., true data line 61 and complement data line 63). There may be, for example, m address lines 67. Address signal ADD0 may be conveyed over first address line 67, while address signal ADDm may be conveyed over $m^{th}$ address line 67 (as an example). The data lines may sometimes be referred to as bit lines. Control lines such as the address lines and data lines are typically orthogonal to each other (e.g., address lines are horizontal while data lines are vertical or vice versa).

The terms "rows" and "columns" merely represent one way of referring to particular groups of cells 20 in memory array 65 and may sometimes be used interchangeably. If desired, other patterns of lines may be used in memory array 65. For example, different numbers of power supply signals, data signals, and address signals may be used.

The signals that are supplied to memory elements 20 may sometimes be collectively referred to as control signals. In particular contexts, some of these signals may be referred to as power signals, clear signals, data signals, address signals, etc. These different signal types are not mutually exclusive.

Control circuitry 66 may include address decoder circuitry 68 and memory error detection and correction circuitry 80. Address decoder circuitry 68 may be used to assert a selected one of the address signals (e.g., address signals ADD0-ADDm) to read or write into cells 20 that are connected to corresponding address line 67. Memory cells 20 that are connected to a common address line may collectively be referred to as a "frame" (or data frame).

Data lines (bit lines) 61 and 63 of each memory cell 20 may be connected to error detection and correction circuitry 80 and other read/write circuitry. During error detection mode, circuitry 80 may be used to scan for soft errors in each data frame. Circuitry 80 of the type shown in FIG. 4 may perform bit-wise data comparison between data read from a selected CRAM frame and an associated predetermined bit stream for each frame in memory array 65. Error detection and correction techniques performed by circuitry 80 may be implemented based on desired logic functions (e.g., logic AND, logic OR, logic XOR, etc.).

As shown in FIG. 4, error detection and correction circuitry 80 may include control circuit 76, data register A (DRA), data register B (DRB), and comparator circuitry 78. Data lines 61 and 63 in each column of memory cells 20 may be coupled to DRA and DRB. Data read from a selected frame may be latched by DRB.

DRA and DRB may be shift registers. DRA and DRB may, for example, shift data in the direction of arrow 79 towards comparator 78. Comparator 78 may be used to perform bit-wise comparisons between bits that are stored in DRA and bits that are stored in DRB. Comparator 78 may receive control signals over control path 81 and may generate error signals at output path 83.

Control circuit 76 may be coupled to DRA and DRB to control DRA and DRB. Control circuit 76 may, for example, be used to load a predetermined bit stream that is associated with the selected frame into DRA (e.g., the predetermined bit stream may be loaded into DRA in parallel or in series). If at least one of the error signals is high during error detection mode, control circuit 76 may be used to load the selected frame with desired data that is generated based on a logic function that receives bits from DRA and DRB as inputs.

Figure 5:
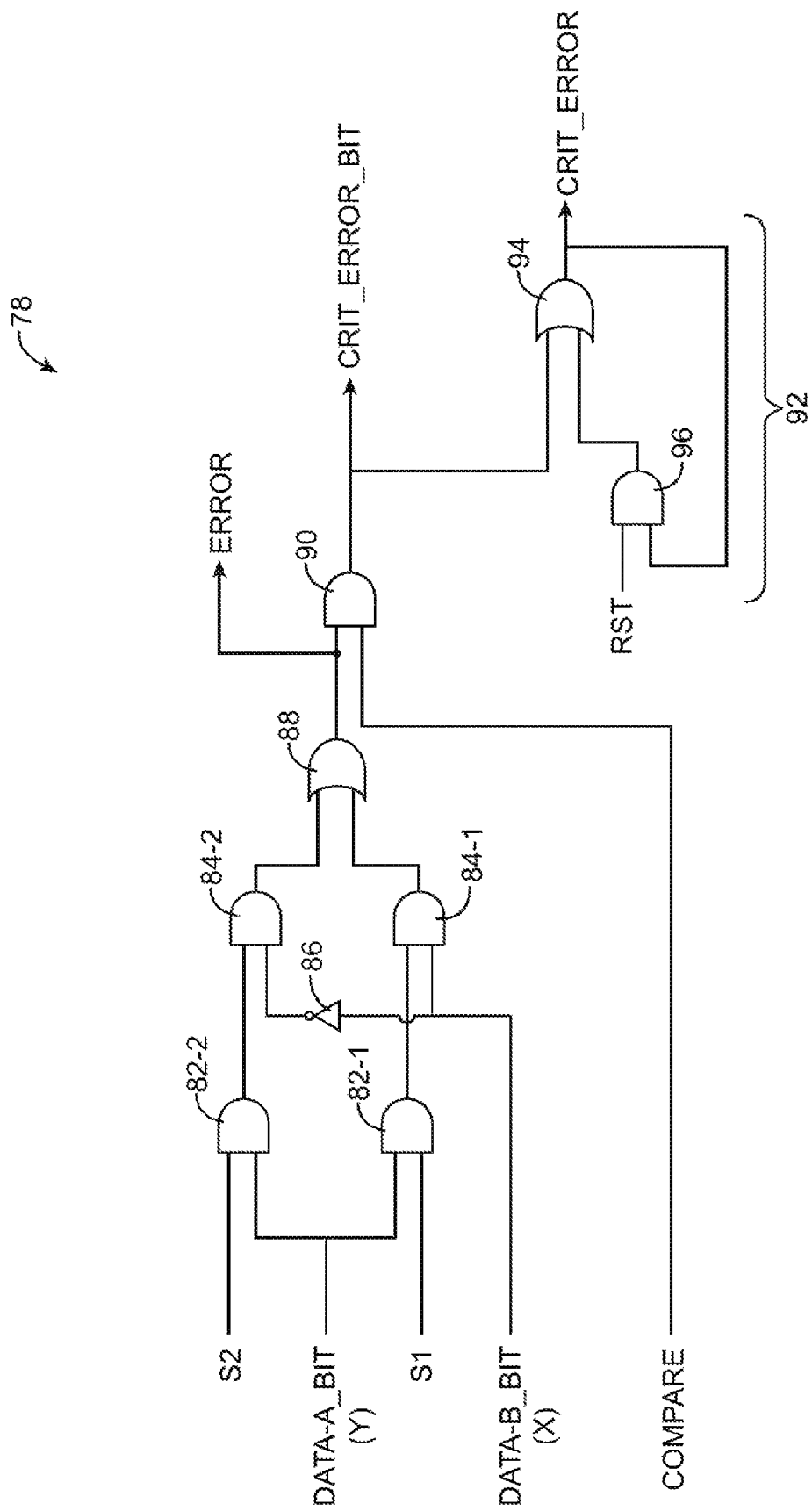
FIG. 5 is a circuit diagram of an illustrative comparator that can be used with the memory error detection and correction circuitry of FIG. 4 in accordance with an embodiment of the present invention.

FIG. 5 is a circuit diagram of comparator 78. As shown in FIG. 5, comparator 78 may receive input signals DATA-A_BIT from DRA (e.g., a rightmost bit Y that is stored in DRA), DATA-B_BIT from DRB (e.g., a rightmost bit X that is stored in DRB), and control signals S1, S2, and COMPARE conveyed over line 81 (FIG. 4). Comparator 78 may output error signals such as ERROR, CRIT_ERROR_BIT, and CRIT_ERROR.

The particular circuit implementation of comparator 78 as shown in FIG. 5 may be based on a first error detection logic function (e.g., a logic AND function—$X*Y$) and a second error detection logic function (e.g., a logic not-AND function—$nX*Y$). For example, if signal S1 is high and signal S2 is low, the error signals will be determined based on the first error detection logic function (e.g., ERROR will be high if X and Y are both logic "1"). Alternatively, if signal S1 is low and signal S2 is high, the error signals will be determined based on the second error detection logic function (e.g., ERROR will be high if X is at logic "0" and Y is at logic "1"). Control signal COMPARE may be high during error detection mode and low during normal operation of device 10.

As shown in FIG. 5, comparator 78 may include logic gates such as AND gates 82-1, 82-2, 84-1, 84-2, 90, inverter 86, logic OR gate 88, and latching circuit 92. AND gate 82-1 may have a first input that receives signal S1 and a second input that receives bit DATA-A_BIT (Y), whereas AND gate 82-2 may have a first input that receives signal S2 and a second input that receives bit DATA-A_BIT. AND gate 84-1 may have a first input that is connected to an output of gate 82-1 and a second input that receives bit DATA-B_BIT (X), whereas gate 84-2 may have a first input that is connected to an output of gate 82-2 and a second input that receives an inverted version of bit DATA-B_BIT through inverter 86. OR gate 88 may have a first input that is connected to an output of gate 84-1 and a second input that is connected to an output of gate 84-2. AND gate 90 may have a first input that is connected to an output of gate 88 and a second input that receives control signal COMPARE.

Signal ERROR may be provided at the output of gate 88. Signal ERROR will be raised high when an error is detected, regardless if the current bit being evaluated is a sensitive bit (e.g., a bit that can adversely affect the functionality of a programmable circuit if flipped by impinging radiation) or a non-sensitive bit (e.g., a bit that does not affect the functionality of a programmable circuit even if erroneously flipped).

Gate 90 may have an output that provides error signal CRIT_ERROR_BIT. CRIT_ERROR_BIT will be raised high when a soft error is detected based on the desired logic function (e.g., X*Y or nX*Y) and when signal COMPARE is high during error detection mode. CRIT_ERROR_BIT may be pulled low when the current CRAM bit that is being scanned is correct or when signal COMPARE is low.

Latch circuit 92 may have a first input that receives signal CRIT_ERROR_BIT, a second input that receives reset signal RST, and an output that generates error signal CRIT_ERROR. Latch circuit 92 may include logic OR gate 94 and logic AND gate 96. AND gate 96 may have a first input that receives signal RST and a second input that is connected to the output of latch circuit 92. OR gate 94 may have a first input that receives signal CRIT_ERROR_BIT, a second input that is connected to an output of gate 96, and an output that generates signal CRIT_ERROR.

Signal RST may be high for a majority of the time during error detection mode. Signal CRIT_ERROR may be initialized to logic "0." During an error detection session, if CRIT_ERROR_BIT is raised high at least once, signal CRIT_ERROR will remain high for the remainder of that error detection session until signal RST is pulled low to reset latch circuit 92.

Comparator 78 as shown in FIG. 5 is merely illustrative. Comparators based on other logic functions may be implemented, if desired.

FIG. 6 shows a truth table of possible error correction logic functions that may be used in the implementation of error detection and correction circuitry 80. There may be at least 16 possible logic functions (e.g., functions that take DATA-B_BIT (X) and DATA-A_BIT (Y) as inputs) that can be used.

As shown in column 200 in FIG. 6, an error correction logic function such as X*nY (e.g., DATA-B_BIT AND'ed with an inverted version of DATA-A_BIT) may be used during optional write-back operations (e.g., the result of the error correction logic function may be written back to the memory cells during optional error correction operations). Other logic functions that may be used include X+Y (i.e., DATA-B_BIT OR'ed with DATA-A_BIT), X*Y (i.e., DATA-B_BIT AND'ed with DATA-A_BIT), X+nY (i.e., DATA-B_BIT OR'ed with an inverted version of DATA-A_BIT), X⊕Y (i.e., DATA-B_BIT XOR'ed with DATA-A_BIT), etc. (see, e.g., columns 202, 204, 206, and 208 in FIG. 5).

FIG. 7 is a table of illustrative data values that may be presented to device 10 during error detection and correction mode. For example, column 210 shows desired bit values for a selected frame. Bits in regions 222 represent the non-sensitive bits, whereas bits in region 224 represent the sensitive bits.

Column 212 shows bit values X that are stored in DRB. There may be two soft errors in the selected frame, as shown by the mismatch in data between the desired bits and the read CRAM bits in rows 226 and 228.

During a first pass of error detection, data bits Y of column 214 may be loaded into DRA (as an example). The data bits of column 214 represent a predetermined bit stream that is based on the not-AND logic function (e.g., a first error correction logic function—X*nY). Data bits X' in column 216 may be generated by inverting the data bits stored in DRA (i.e., data bits Y of column 214) and AND'ing them with the data bits stored in DRB (i.e., data bits X of column 212). Data bits X' may be optionally written back to the selected frame. Note that data bits X' in regions 222 remain unchanged from the read values, because those bits are irrelevant to the functionality of device 10 and are therefore not altered.

Data bits X' may be written back to the selected CRAM frame. The erroneous data bit in row 228 may be changed to the correct bit (see, e.g., FIG. 7), because bits in region 224 needs to be correct for proper functionality of device 10. As a result, signal CRIT_ERROR_BIT may be asserted based on the AND logic function (e.g., a first error detection logic function—X*Y), because both bits X and Y at logic "1" indicates the presence of a soft error in the first pass. The first error detection logic function may be associated with the first error correction logic function. In the first pass, DRA may sometimes be referred to as a "0-frame" because it serves to detect and correct soft errors for the sensitive data bits that should be "0" (e.g., erroneously high bits are corrected during the first pass).

In a second pass of error detection, data bits Y' of column 218 may be loaded into DRA. The data bits of column 218 represent a predetermined bit stream that is based on the logic OR function (e.g., a second error correction logic function—X'+Y'). Data bits X" in column 220 may be generated by OR'ing the data bits currently stored in DRB (i.e., data bits X' of column 216) with the data bits currently stored in DRA (i.e., data bits Y' of column 218. Data bits X" generated in this way may be optionally written back to the selected frame to correct the detected soft errors. Note that data bits X" in regions 222 remain unchanged from bits X', because those bits are irrelevant to the functionality of device 10 and are therefore not altered.

The erroneous data bit in row 226 may be changed to the correct bit (see, e.g., FIG. 7), because bits in region 224 needs to be correct for proper functionality of device 10. Signal CRIT_ERROR_BIT may be asserted based on the not-AND logic function (e.g., a second error detection logic function—nX*Y), because bit X' being low and bit Y' being high indicates the presence of a soft error in the second pass. The second error detection logic function may be associated with the second error correction logic function. In the second pass, DRA may sometimes be referred to as a "1-frame" because it serves to detect and correct soft errors for the sensitive data bits that should be "1" (e.g., erroneously low bits are corrected during the second pass). The logic functions described in these examples are merely illustrative. Other desired logic functions may be used in the first or second pass, if desired. More than two passes or a single pass of error detection may be used, if desired.

The differentiation between sensitive and non-sensitive bits may be controlled by signal COMPARE. Signal COMPARE may be high when scanning the sensitive data bits in region 224 and low when scanning the non-sensitive data bit sin regions 222 and during normal operation of device 10. The assignment of sensitive bits versus non-sensitive bits may be obtained automatically using the design tools described in connection with FIG. 2. If desired, a user may manually mark specific bits as sensitive or non-sensitive. For example, the user may mark bits that control "state-full" circuits (e.g., circuits that are modeled after a finite state machine) as sensitive or may mark bits that control "non-state-full" circuits (e.g., circuits such as a first-in-first-out (FIFO) circuit) as non-sensitive, because incorrect bits in a non-state-full circuit may be flushed out over time.

Figure 8:
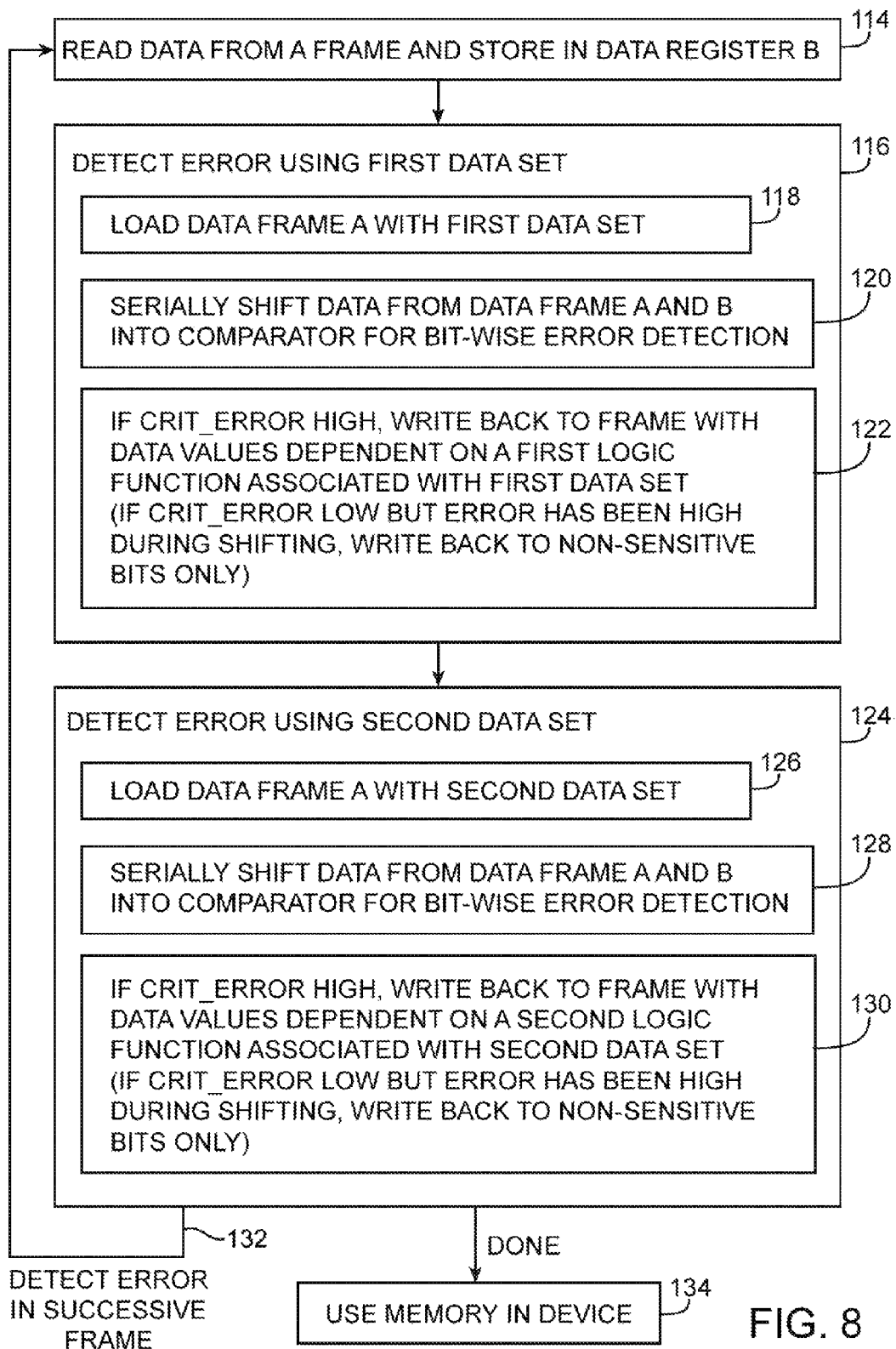
FIG. 8 is a flow chart of illustrative steps involved in detecting and correcting soft errors on an integrated circuit using the memory error detection and correction circuitry of FIG. 4 in accordance with an embodiment of the present invention.

FIG. 8 shows steps involved in operating error detection and correction circuitry 80 of the type described in connection with FIG. 4. At step 114, a first frame may be read and stored in DRB. At step 116, DRB may be scanned for soft errors by using a first data set (e.g., a first predetermined bit stream). For example, DRA may be loaded with the first data set (step 118). DRA and DRB may serially shift data into comparator 78 for bit-wise error detection (step 120).

During this process, if signal CRIT_ERROR is raised high, new data values that are generated based on a first error correction logic function associated with the first data set may optionally be written back to the first frame (step 122). If CRIT_ERROR is low but ERROR has been raised high at least once during that error detection session, the desired data bits may optionally be written to only the non-sensitive bits in the selected frame (e.g. by placing desired write data values on the data lines for the non-sensitive bits and by precharging the data lines of the sensitive bits to high voltages). If desired, a chip reset may be performed to reload the entire device when CRIT_ERROR is high. If desired, a user of device 10 may select to perform an application specific response. For example, consider a scenario in which device 10 is used in a network system. In an event that a soft error is detected (e.g., signal CRIT_ERROR is high), the user may choose to run an operation that flushes the network buffers, an operation that initiates retransmission of data, etc.

At step 124, DRB may be scanned for soft errors by using a second data set (e.g., a second predetermined bit stream). For example, DRA may be loaded with the second data set (step 126). DRA and DRB may serially shift data into comparator 78 for bit-wise error detection (step 128).

During this process, if signal CRIT_ERROR is raised high, new data values that are generated based on a second error correction logic function associated with the first data set may optionally be written back to the first frame (step 130). If CRIT_ERROR is low but ERROR has been raised high at least once during that error detection session, desired data bits may optionally be written to only the non-sensitive bits in the selected frame. If desired, a chip reset may be performed to reload the entire device when CRIT_ERROR is high.

Processing may loop back to step 114 to detect and correct soft errors in a successive frame, as indicated by path 132. Once every frame has been scanned and corrected, device 10 may be place in normal operation (step 134). Error detection and correction circuitry 80 may be used to continuously monitor the memory bits stored in device 10 during its lifetime, if desired.

Figure 9:
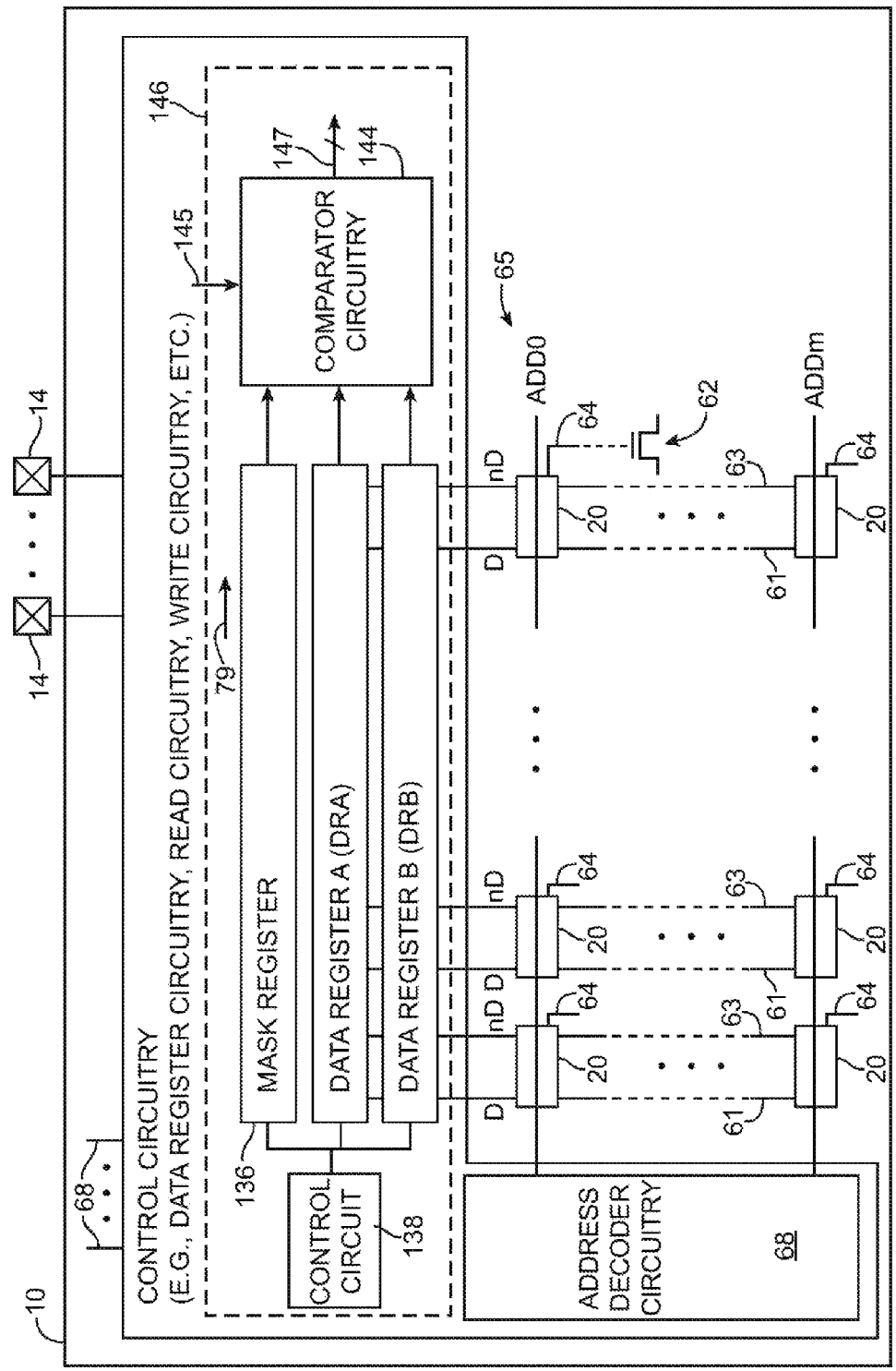
FIG. 9 is a diagram of an illustrative integrated circuit with memory error detection and correction circuitry in accordance with an embodiment of the present invention.

FIG. 9 shows another suitable arrangement of memory error detection and correction circuitry. As shown in FIG. 9, error detection and correction circuitry 146 may include mask register 136, data register A (DRA), data register B (DRB), control circuit 138, and comparator 144.

Circuitry 146 of the type shown in FIG. 9 may perform bit-wise comparison between data read from a selected CRAM frame and the desired data for the selected CRAM frame. Error signals may be raised high when a mismatch is detected. Desired data bits may optionally be written back to the selected CRAM frame if corresponding bits stored in mask register 136 are high.

Data lines 61 and 63 in each column of memory cells 20 may be coupled to DRA and DRB. Data read from a selected frame may be latched by DRB. DRA, DRB, and mask register 136 may be shift registers. DRA, DRB, and mask register 136 may, for example, shift data in the direction of arrow 79 towards comparator 144. Comparator 144 may be used to perform bit-wise data comparisons between bits that are stored in DRA and bits that are stored in DRB. Comparator 144 may receive control signals over control path 145 and may generate error signals at output path 147.

Control circuit 138 may be used to control DRA, DRB, and mask register 136. Control circuit 138 may obtain data from configuration device 40 (FIG. 2) through pins 14 and may provide this data to data register DRA and/or mask register 136. Control circuit 138 may, for example, be used to load a desired bit stream (e.g., a bit stream having the desired CRAM bits) into DRA (e.g., the desired bit stream may be loaded into DRA in parallel or in series). If at least one of the error signals is high during error detection mode, control circuit 138 may be used to load at least a portion of the selected frame with the desired data loaded in DRA.

Figure 10:
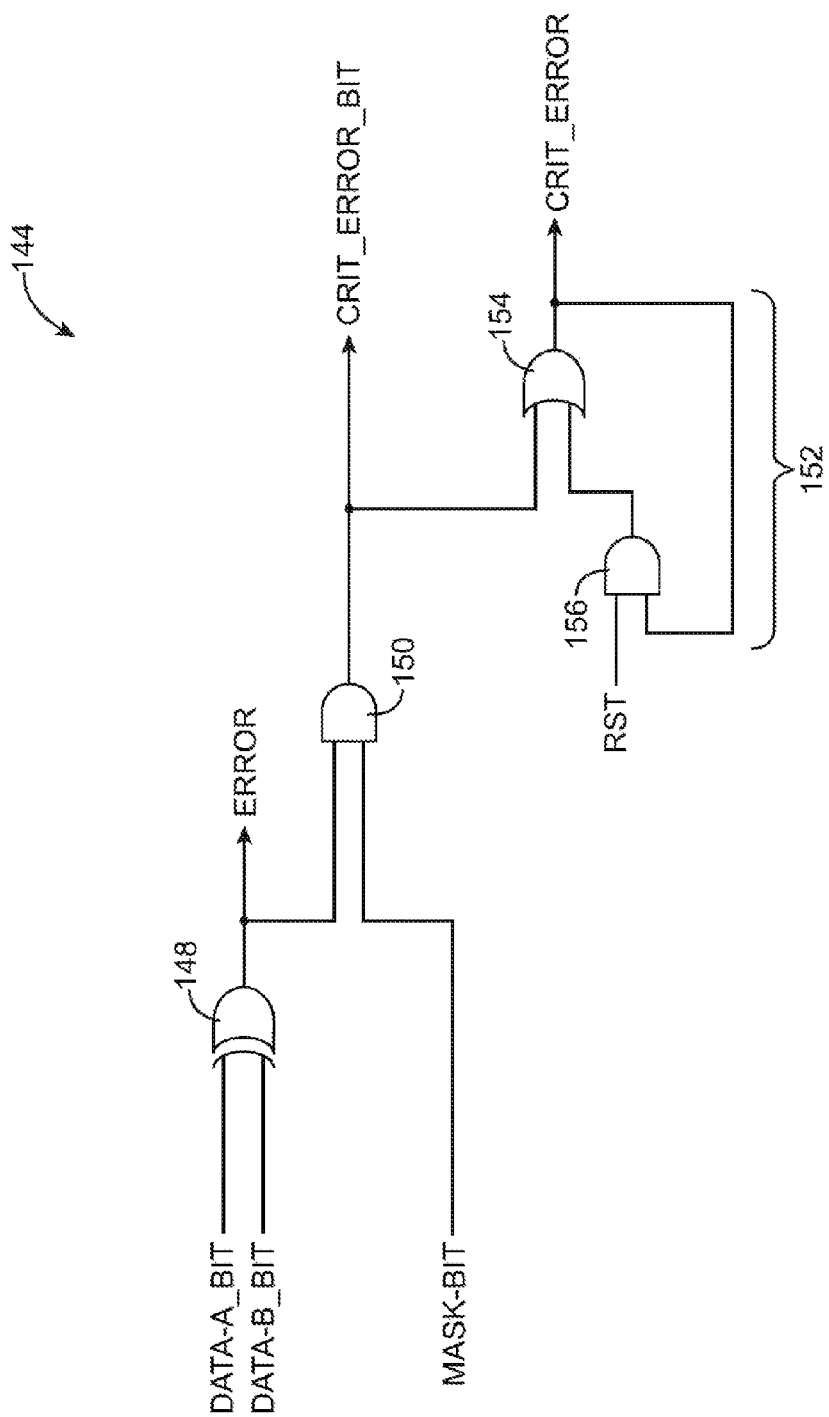
FIG. 10 is a circuit diagram of an illustrative comparator that can be used with the memory error detection and correction circuitry of FIG. 9 in accordance with an embodiment of the present invention.

FIG. 10 is a circuit diagram of comparator 144. Comparator 144 may have a first input that receives DATA-A_BIT (e.g., a rightmost bit that is stored in DRA), a second input that receives DATA-B_BIT (e.g., a rightmost bit that is stored in DRB), and a third input that receives MASK_BIT (e.g., a rightmost bit that is stored in mask register 136).

As shown in FIG. 10, comparator 144 may include logic XOR gate 148, AND gate 150, and latch circuit (error latching circuitry) 152. XOR gate 148 may have a first input that serves as the first input of comparator 144, a second input that serves as the second input of comparator 144, and an output that provides error signal ERROR. Signal ERROR may be raised high when there is a mismatch between the rightmost data bits stored in DRA and DRB. Gate 150 may have a first input that receives signal ERROR, a second input that receives MASK_BIT, and an output on which signal CRIT_ERROR_BIT is provided. CRIT_ERROR_BIT may be raised high when ERROR and MASK_BIT are simultaneously high. In this way, the value of MASK_BIT serves as an enable/disable control signal for error signal latching circuit 152. If MASK_BIT is low, ERROR will not pass to the input of OR gate 154 (i.e., error signal latching is disabled, even in the presence of detected soft errors). If MASK_BIT is high, error signal latching is enabled and ERROR will be passed to the input of OR gate 154. Latch circuit 92 may have a first input that receives signal CRIT_ERROR_BIT, a second input that receives reset signal RST, and an output that generates error signal CRIT_ERROR.

Latch circuit 152 may include logic OR gate 154 and logic AND gate 156. AND gate 156 may have a first input that receives signal RST and a second input that is connected to the output of latch circuit 152. OR gate 154 may have a first input that receives signal CRIT_ERROR_BIT, a second input that is connected to an output of gate 156, and an output that generates signal CRIT_ERROR. Signal RST may be high for a majority of the time during error detection operations. Signal CRIT_ERROR may be initialized to logic "0." During error detection mode, if CRIT_ERROR_BIT is raised high at least once, signal CRIT_ERROR will remain high for the remainder of that error detection session until signal RST is pulled low to reset latch circuit 152.

Comparator 144 as shown in FIG. 10 is merely illustrative. Other suitable types of comparator may be used, if desired.

FIG. 11 is a table of illustrative data values that may be presented to device 10 during error detection and correction mode. For example, column 230 shows desired bit values for a selected frame. Bits in regions 158 represent non-sensitive bits (e.g., bits that do not affect the functionality of a programmable circuit even if soft errors are present) or non-sensitive bit (e.g., bits that can adversely affect the functionality of a programmable circuit if flipped by impinging radiation).

Column 232 shows bit values that are stored in mask register 136. The bit values latched in register 136 (i.e., MASK_BIT) corresponding to the non-sensitive bits are logic "0," whereas the bit values corresponding to the sensitive bits are logic "1." The mask bits serve to mark the location of sensitive bits (e.g., a CRAM bit corresponding to a high mask bit is a sensitive bit, whereas a CRAM bit corresponding to a low mask bit is a non-sensitive bit).

Data register A may be loaded with correct (desired) data using control circuit 138. As shown in column 234 of FIG. 11, the DATA-A_BIT values in regions 158 are logic "0," whereas the DATA-A_BIT values in region 160 match the desired bits in region 160.

Data read from the selected frame may be stored in data register B (see, e.g., column 236 of FIG. 11). Rows 162 and 166 show matching DATA-A_BIT and DATA_B_BIT values, whereas rows 164 and 168 show mismatches between the DATA-A_BIT values and the DATA-B_BIT values. These mismatches are a result of soft errors. Mismatches between DATA-A_BIT and DATA-B_BIT values will always raise signal ERROR, while mismatches between DATA-A_BIT and DATA-B_BIT will only raise signal CRIT_ERROR_BIT if corresponding MASK_BIT is also high.

As shown in column 238, new CRAM values may be generated using control circuit 138. The new CRAM bit values corresponding to the non-sensitive bits (e.g., bits in regions 158) may remain the same as the corresponding read CRAM bits stored in DRB (see, e.g., rows 162 and 166 in FIG. 11), whereas the new CRAM bit values corresponding to the sensitive bits (e.g., bits in region 160) may be equal to the corresponding desired CRAM bits stored in DRA (see, e.g., rows 164 and 168 in FIG. 11). The new CRAM bit values in column 238 may optionally be written back to the selected frame when any one of the error signals is high.

Figure 12:
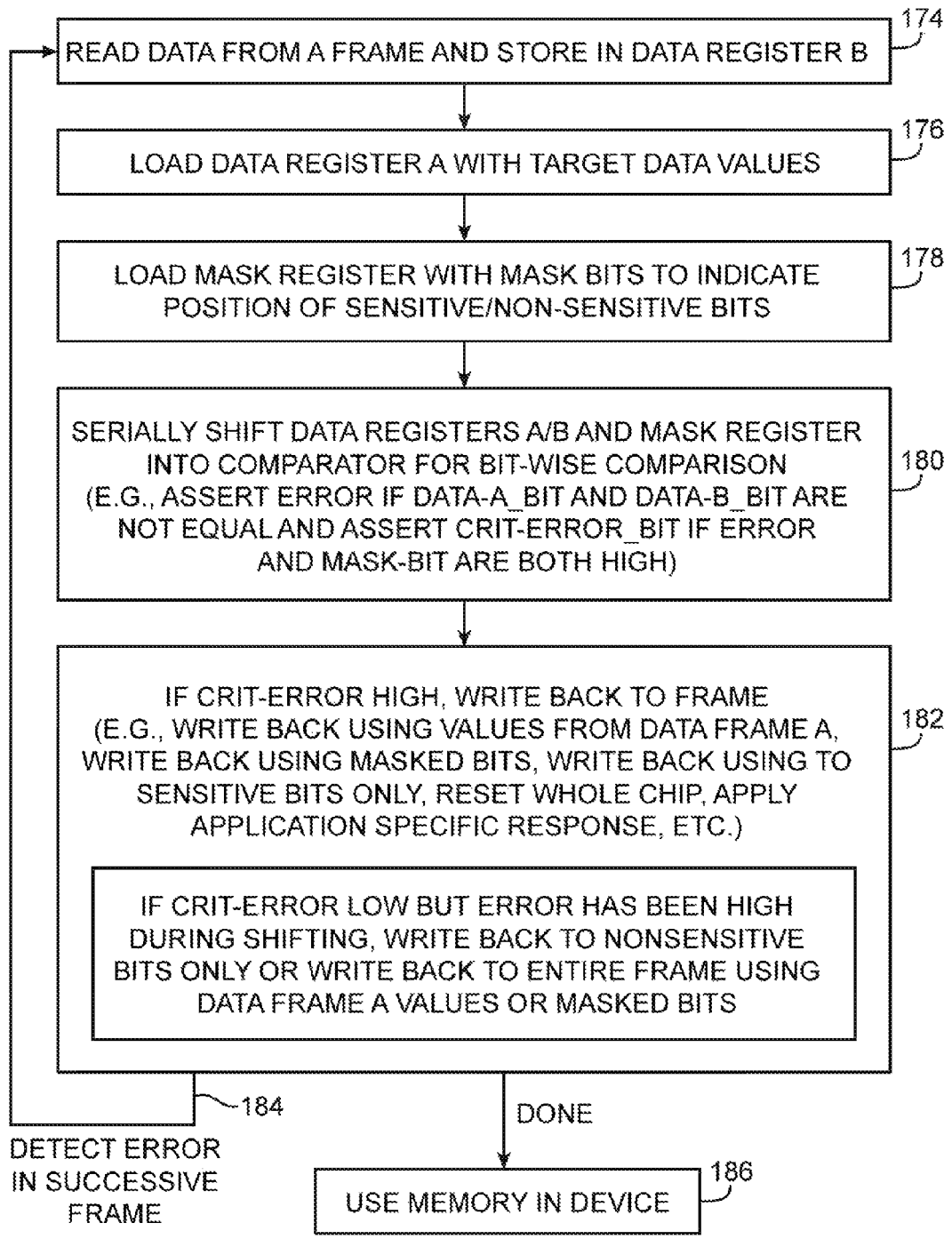
FIG. 12 is a flow chart of illustrative steps involved in detecting and correcting soft errors on an integrated circuit using the memory error detection and correction circuitry of FIG. 9 in accordance with an embodiment of the present invention.

FIG. 12 shows steps involved in operating error detection and correction circuitry 146 of the type described in connection with FIG. 9. At step 174, a first frame may be read and stored in DRB. At step 176, DRA may be loaded with desired data values. At step 178, mask register 136 may be loaded with mask bits to indicate the position of sensitive and non-sensitive bits (e.g., mask bits corresponding to sensitive bits are "1," whereas mask bits corresponding to non-sensitive bits are "0").

At step 180, the contents of DRA, DRB, and mask register 136 may be serially shifted into comparator 144 for bit-wise comparison. During this process, ERROR may be asserted when DATA-A_BIT and DATA-B_BIT values are not equal, while CRIT_ERROR_BIT may be asserted when ERROR and corresponding MASK_BIT are both high.

At step 182, if signal CRIT_ERROR is high, new CRAM bit values generated using control circuit 138 based on the values in DRA, DRB, and mask register 136 may optionally be written back to the selected frame. New CRAM values may only be written back to the sensitive bits (e.g., by placing desired write data values on the data lines of the cells storing the sensitive bits and by precharging the data lines of the cells storing the non-sensitive bits to high voltages). If desired, device 10 may be reset to reconfigure the entire chip. If desired, a user of device 10 may select to perform an application specific response. For example, consider a scenario in which device 10 is used in a network system. In an event that a soft error is detected (e.g., signal CRIT_ERROR is high), the user may choose to run an operation that flushes the network buffers, an operation that initiates retransmission of data, etc.

If CRIT_ERROR is low but signal ERROR has been raised during error scanning, the correct bits (e.g., bits stored in DRA) may optionally be written back to only the non-sensitive bits (e.g., by placing desired write data values on the data lines of the cells storing the non-sensitive bits and by precharging the data lines of the cells storing the sensitive bits to high voltages). If desired, the selected frame may be entirely overwritten with values in DRA.

Processing may loop back to step 174 to detect and correct soft errors in a successive frame, as indicated by path 184. Once every frame has been scanned and corrected, device 10 may be place in normal operation (step 186). Error detection and correction circuitry 144 may be used to continuously monitor the memory bits stored in device 10 during its lifetime, if desired.

The foregoing is merely illustrative of the principles of this invention and various modifications can be made by those skilled in the art without departing from the scope and spirit of the invention.

What is claimed is:

1. A method of detecting soft errors in memory elements on an integrated circuit, comprising:
   obtaining data bits from the memory elements;
   obtaining predetermined data bits;
   with comparator circuitry on the integrated circuit, comparing each of the data bits with a corresponding one of the predetermined data bits to identify correctable erroneous data bits; and
   correcting a subset of the identified correctable erroneous data bits; and
   loading mask bits into a mask register, wherein comparing each of the data bits comprises latching an error signal with the comparator circuitry in response to detection of a correctable soft error in the data bits when the mask bits enable latching and not latching the error signal with the comparator circuitry in response to detection of the correctable soft error when the mask bits disable latching.

2. The method defined in claim 1 wherein obtaining the data bits comprises loading data bits into a first data register on the integrated circuit and wherein obtaining the predetermined bits comprises loading the predetermined bits into a second data register on the integrated circuit.

3. The method defined in claim 2 wherein comparing each of the data bits comprises:
   shifting the data bits from the first data register and the predetermined data bits from the second data register through the comparator circuitry.

4. The method defined in claim 3 wherein comparing each of the data bits comprises:

asserting an error signal with the comparator circuitry in response to detection of at least one soft error in the data bits while shifting the data bits from the first data register and the predetermined data bits from the second data register through the comparator circuitry.

5. The method defined in claim 2, further comprising:
while the data bits are stored in the first data register, loading the second data register with new predetermined bits.

6. The method defined in claim 1, further comprising:
with a latch circuit in the comparator circuitry, latching an error signal that is indicative of a soft error in the data bits.

7. The method defined in claim 1, wherein the comparator circuitry is operable in first and second modes of operation and wherein correcting the subset of the identified correctable erroneous data bits further comprises:
correcting the subset of identified correctable erroneous data bits during the first mode of operation; and
correcting a remainder of the identified correctable erroneous data bits during the second mode of operation.

8. The method defined in claim 1, wherein comparing each of the data bits comprises:
comparing the data bits obtained from the memory elements to at least first and second sets of predetermined data bits, wherein the second set of predetermined data bits is different from the first set of predetermined data bits, wherein the first set of predetermined data bits is associated with a first error detection logic function, and wherein the second set of predetermined data bits is associated with a second error detection logic function that is different from the first error detection logic function.

9. The method defined in claim 8, wherein comparing each of the data bits comprises:
identifying the correctable erroneous data bits by comparing each of the data bits to the first set of predetermined data bits using the first error detection logic function; and
identifying additional erroneous data bits by comparing each of the data bits to the second set of predetermined data bits using the second error detection logic function.

10. A method of detecting soft errors in memory elements on an integrated circuit, comprising:
obtaining data bits from the memory elements;
obtaining predetermined data bits;
with comparator circuitry on the integrated circuit, comparing each of the data bits with a corresponding one of the predetermined data bits;
loading mask bits into a mask register, wherein comparing each of the data bits comprises latching an error signal with the comparator circuitry in response to detection of a soft error in the data bits when the mask bits enable latching and not latching the error signal with the comparator circuitry in response to detection of the soft error when the mask bits disable latching.

11. An integrated circuit, comprising:
memory elements;
a first data register operable to receive data bits from the memory elements that potentially contain soft errors;
a second data register operable to receive predetermined data bits;
comparator circuitry that compares each of the data bits with a corresponding one of the predetermined data bits; and
a mask register loaded with mask bits, wherein the comparator circuitry is operable to compare each of the data bits with the predetermined data bits while the data bits from the first and second data registers and the mask bits are shifted through the comparator circuitry.

12. The integrated circuit defined in claim 11 wherein the comparator circuitry comprises error latching circuitry that latches an error signal in response to detection of a soft error in the data bits when the mask bits enable latching and that does not latch the error signal in response to detection of the soft error when the mask bits disable latching.

13. The integrated circuit defined in claim 12 wherein the comparator circuitry comprises an exclusive OR gate that compares the data bits from the first data register with the predetermined bits from the second data register.

14. The integrated circuit defined in claim 13 wherein the comparator circuitry comprises:
a logic gate with a first input that receives output signals from the exclusive OR gate and a second input that receives the mask bits from the mask register.

15. The integrated circuit defined in claim 14 wherein the error latching circuitry has an input coupled to an output of the logic gate.

* * * * *